(12) United States Patent
Veerasamy et al.

(10) Patent No.: US 6,815,690 B2
(45) Date of Patent: Nov. 9, 2004

(54) ION BEAM SOURCE WITH COATED ELECTRODE(S)

(75) Inventors: Vijayen S. Veerasamy, Ann Arbor, MI (US); Rudolph Hugo Petrmichl, Ann Arbor, MI (US); Henry A. Luten, Ypsilanti, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 170 days.

(21) Appl. No.: 10/200,553

(22) Filed: Jul. 23, 2002

(65) Prior Publication Data

US 2004/0016640 A1 Jan. 29, 2004

(51) Int. Cl.$^7$ ................................................ H01J 37/08
(52) U.S. Cl. .................. 250/423 R; 250/426; 250/427; 250/492.21
(58) Field of Search ............................ 250/423 R, 426, 250/427, 492.21; 315/111.81; 216/66; 427/530

(56) References Cited

U.S. PATENT DOCUMENTS

| | | | |
|---|---|---|---|
| 4,721,878 A | | 1/1988 | Hagiwara et al. |
| 5,089,746 A | * | 2/1992 | Rosenblum et al. .... 315/111.81 |
| 5,508,368 A | | 4/1996 | Knapp et al. |
| 5,640,020 A | * | 6/1997 | Murakoshi et al. .... 250/492.21 |
| 5,656,819 A | | 8/1997 | Greenly |
| 5,858,477 A | | 1/1999 | Veerasamy et al. |
| 5,888,593 A | | 3/1999 | Petrmichl et al. |
| 5,973,447 A | | 10/1999 | Mahoney et al. |
| 6,002,208 A | | 12/1999 | Maishev et al. |
| 6,037,717 A | | 3/2000 | Maishev et al. |
| 6,147,354 A | | 11/2000 | Maishev et al. |
| 6,153,067 A | | 11/2000 | Maishev et al. |
| 6,156,630 A | | 12/2000 | Iyer |
| 6,238,526 B1 | | 5/2001 | Maishev et al. |
| 6,246,059 B1 | | 6/2001 | Maishev et al. |
| 6,261,424 B1 | | 7/2001 | Goncharenko et al. |
| 6,287,711 B1 | | 9/2001 | Nieh et al. |
| 6,335,086 B1 | | 1/2002 | Veerasamy |
| 6,338,901 B1 | | 1/2002 | Veerasamy |
| 6,352,626 B1 | | 3/2002 | von Zweck |
| 6,359,388 B1 | | 3/2002 | Petrmichl |
| 6,368,664 B1 | | 4/2002 | Veerasamy et al. |
| 6,395,333 B2 | | 5/2002 | Veerasamy |
| 6,664,739 B1 | | 12/2003 | Kishinevsky et al. |

FOREIGN PATENT DOCUMENTS

| | | |
|---|---|---|
| DE | 291 421 | 6/1991 |
| JP | 62-97243 | 5/1987 |
| JP | 3-108237 | 5/1991 |
| WO | WO 00/05742 | 2/2000 |
| WO | WO 01/09918 | 2/2001 |

* cited by examiner

Primary Examiner—Jack I. Berman
(74) Attorney, Agent, or Firm—Nixon & Vanderhye P.C.

(57) ABSTRACT

An ion source includes an anode and/or cathode which is/are coated with a conductive coating. The coating has a sputtering yield less than that of an uncoated anode and/or cathode, so that erosion of the resulting anode and/or cathode in the source is reduced during source operation. Example coating materials for the anode and/or cathode of the ion beam source include metal borides including but not limited to $TiB_2$ and $ZrB_2$.

22 Claims, 3 Drawing Sheets

ION BEAM SOURCE WITH COATED ELECTRODE(S)

This invention relates to an ion source including an electrode(s) that is at least partially coated with a coating. In certain example embodiments, a surface(s) of a cathode and/or anode of an ion source may be at least partially coated with a conductive coating for the purpose(s) of: reducing electrode erosion over time, reducing the required frequency of cleaning, reducing contamination of the substrate, and/or improving ion beam characteristics.

BACKGROUND OF THE INVENTION

Ion beam sources are known in the art. For example and without limitation, see the various ion beam sources of U.S. Pat. Nos. 5,508,368; 5,656,819; 5,888,593; 5,973,447; 6,002,208; 6,037,717; 6,147,354; 6,153,067; 6,238,526; 6,246,059; 6,335,086; 6,338,901; 6,359,388; 6,368,664; and 6,395,333, all of which are hereby incorporated herein by reference.

An ion source is a device that causes gas molecules to be ionized and then focuses, accelerates and/or emits the ionized gas molecules and/or atoms in a beam or the like toward a substrate. Such an ion beam may be used for various purposes including but not limited to cleaning a substrate, etching a substrate, milling off a portion of a substrate, and/or depositing thin film(s) on a substrate.

An ion source discussed in U.S. Pat. No. 6,359,388, for example, includes a steel cathode (which includes iron) defining an ion emitting slit. An anode is arranged adjacent to the slit and the cathode so as to be spaced therefrom. An electric field is generated between the anode and cathode. Electron collisions with a working gas in or proximate the electric field leads to ionization and a plasma is generated. The term "plasma" means a cloud of gas including ions of a material to be accelerated and/or emitted toward a substrate. The plasma expands and fills a region including the ion emitting slit defined by cathode portions. Electrons in an ion acceleration space proximate the slit are propelled by the known E×B drift in a closed loop path within the region of crossed electric and magnetic field lines proximate the slit. An ion beam is thus directed from the slit toward a substrate.

Unfortunately, conventional ion beam sources suffer from the problem that during use the electrode(s) (e.g., cathode and/or anode) erode over time. For example, consider a situation where the cathode (or anode) is made of steel—which includes iron. During use of the ion beam source, exposed surface portions of at least the cathode are prone to erosion.

This type of electrode erosion is problematic for a number of reasons. First, significant erosion of the cathode over time can cause the width of the slit (i.e., the magnetic gap) to significantly change which in turn can adversely affect ion beam processing conditions and lead to non-uniform coatings, etchings, etc. Second, significant eroded material from the cathode (e.g., iron) can make its way onto the substrate and/or into a film being ion beam deposited on the substrate, thereby leading to contamination of the substrate and/or film. This latter problem may be characterized by saying that the exposed steel electrode is sputtered during operation of the ion beam source and an undesirably large amount of sputtered material therefrom makes its way onto the substrate and/or film thereby contaminating the same.

In view of the above, it will be appreciated that there exists a need in the art for an ion source (and/or corresponding method) that enables at least one of the aforesaid problems to be reduced and/or overcome.

BRIEF SUMMARY OF THE INVENTION

An object of certain example embodiments of this invention is to provide an ion source (e.g., of the cold-cathode closed-drift type) that includes at least one electrode (anode and/or cathode) that is coated with a coating.

Certain example embodiments of this invention fulfill one or more of the above-listed objects and/or needs by providing an ion source comprising: an anode and a cathode, with an electric gap defined between the anode and the cathode; and wherein at least one of the anode and cathode is at least partially coated with a conductive coating comprising a metal boride.

Certain other example embodiments of this invention fulfill one or more of the above-listed objects and/or needs by providing an ion source comprising: a conductive anode and a conductive cathode, with an electric gap defined between the anode and the cathode; and wherein the ion source is manufactured so that at least one of the anode and cathode is at least partially coated with a coating comprising a metal boride. In certain example embodiments, the metal boride may be $MeB_x$, where Me (metal) is one of Ti, Zr, Ta and Fe.

Certain other example embodiments of this invention fulfill one or more of the above-listed objects and/or needs by providing an ion source comprising: a conductive anode and a conductive cathode, with an electric gap defined between the anode and the cathode; and wherein the ion source is manufactured so that at least one of the anode and cathode is at least partially coated with a conductive coating that has a sputtering yield of no more than about 20% of that of an uncoated anode or cathode.

Certain other example embodiments of this invention fulfill one or more of the above-listed objects and/or needs by providing a method of making an ion beam source, the method comprising: providing an anode and a cathode; coating at least a portion of the anode and/or cathode with a conductive coating characterized by at least one of: (a) the coating comprises a metal boride, (b) the coating has a bulk resistivity of no greater than about $20 \times 10^{-5}$ ohms-cm, (c) the coating has a sputtering yield of no more than about 20% of that of an uncoated anode or cathode; and arranging the anode and cathode so as to define an electric gap therebetween in the ion beam source.

Still further example embodiments of this invention fulfill one or more of the above-listed objects and/or needs by providing a method of making a coated article, the method comprising: providing an ion beam source including an anode and cathode with an electric gap defined therebetween, wherein at least a portion of the anode and/or cathode is coated with a conductive coating that is characterized by at least one of: (a) the coating comprises a metal boride, (b) the coating has a bulk resistivity of no greater than about $20 \times 10^5$ ohms-cm, (c) the coating has a sputtering yield of no more than about 20% of that of an uncoated anode or cathode; providing a substrate under or above the ion source; and causing flow of at least one gas through the electric gap between the anode and cathode so as to ionize gas, and wherein ions are directed from the source toward the substrate in order to etch, mill and/or form a film on the substrate.

Still further embodiments of this invention fulfill one or more of the above-listed objects and/or needs by providing a an ion source comprising: a conductive anode and a conductive cathode, with a gap defined between the anode and the cathode; and wherein the ion source is manufactured so that at least one of the anode and cathode is at least partially coated with a coating comprising at least one of: a boride, a nitride, and a carbide.

DETAILED DESCRIPTION OF EXAMPLE EMBODIMENTS OF THE INVENTION

Certain example embodiments of this invention relate to an ion source of any suitable type that includes a plurality of electrodes (e.g., at least one anode and cathode). In certain embodiments, at least one of the electrodes is coated with a coating that has a sputtering yield less than that of the same electrode if uncoated. In certain embodiments, the electrode coating may be conductive and/or may be resistant to oxidation (i.e., refractory) which can occur during cleaning and/or source operation.

Because of the coating provided on at least one of the electrode(s) of the ion source, variation of the magnetic gap and/or electric gap of the source over time is significantly reduced compared to that of an uncoated electrode design. Moreover, the electrode coating enables contamination of the substrate and/or of a film being deposited to be reduced compared to use of an uncoated electrode.

Figure 1:
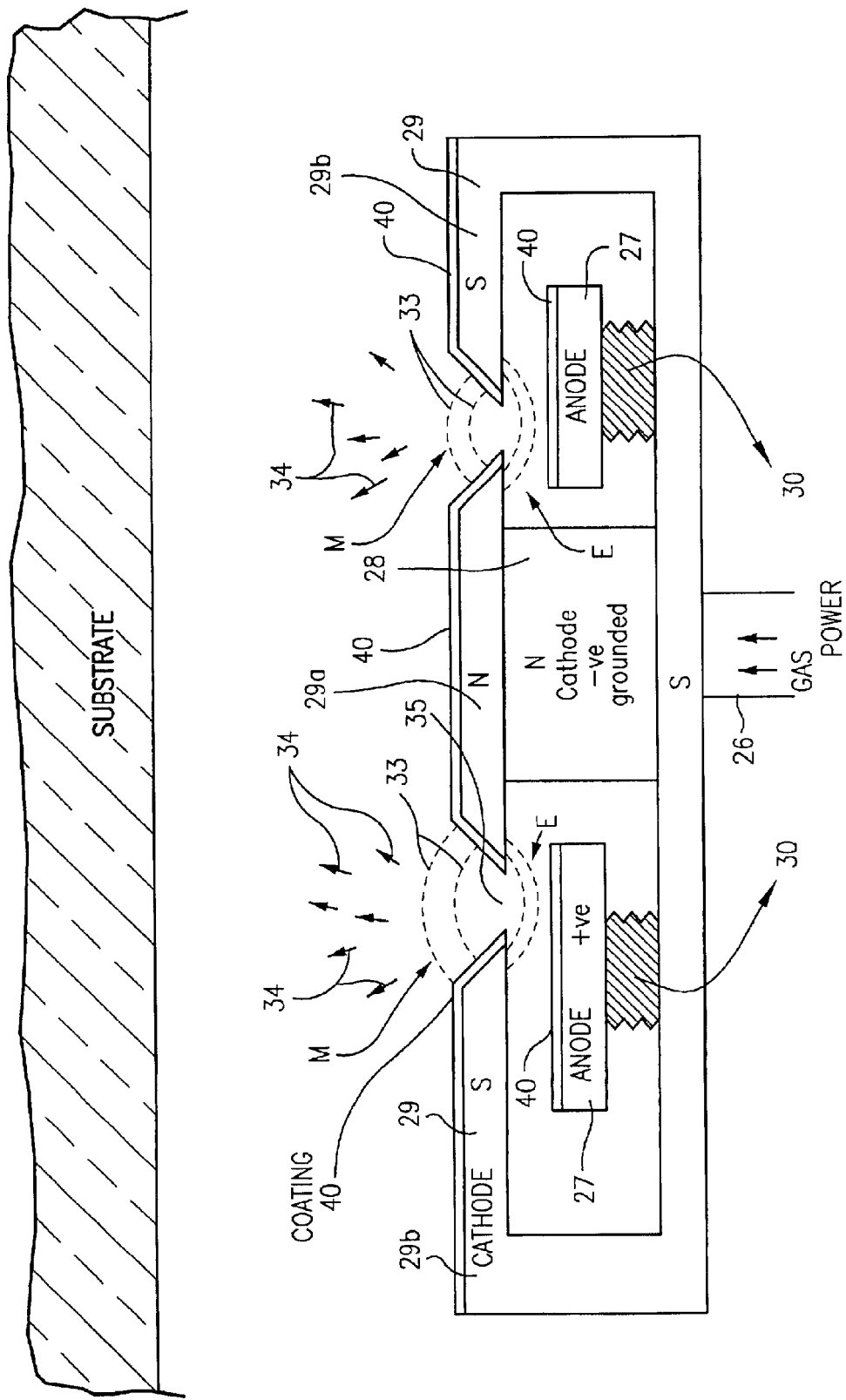
FIG. 1 is a is a partial cross sectional view of a cold cathode closed drift type ion beam source according to an example embodiment of this invention.
Figure 2:
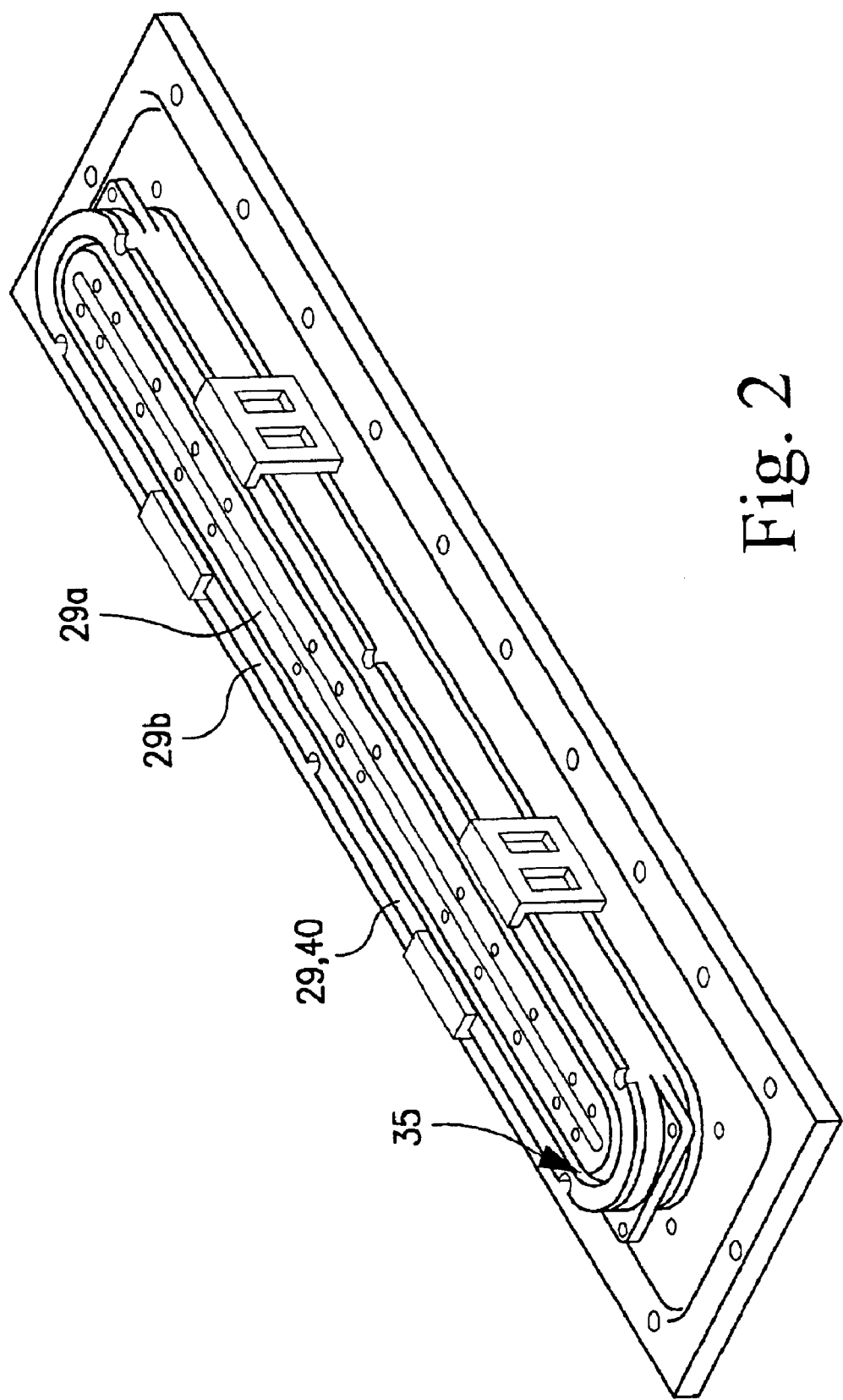
FIG. 2 is a perspective view of the ion beam source of FIG. 1.

FIGS. 1–2 illustrate an example ion source according to an embodiment of this invention. The illustrated source is a cold-cathode closed-drift type ion beam source which is preferred in certain embodiments of this invention, although the invention is not limited to this type of source (e.g. the invention may be used for example with other types of gridless sources). The ion beam source includes at least one gas/power inlet 26, a conductive anode 27, a conductive cathode 29, a grounded cathode magnet portion 28, an insulator 30, and other known ion beam components. It can be seen in FIG. 2 that the anode and cathode (and thus the slit 35) are racetrack shaped in this example illustrated embodiment. The source may be operated in an evacuated chamber (not shown) or in any other suitable context in different embodiments of this invention. At least one of the anode 27 and/or cathode 29 is at least partially coated with a coating 40 to be more fully discussed below.

Operation of the FIGS. 1–2 ion beam source involves flow one or more feedstock gas(es) and/or cleaning gas(es) through the electric gap (E) between the anode 27 and cathode 29 while maintaining a DC or rectified AC bias across the electric gap (E). Simultaneously, a transverse magnetic field traps electrons into a closed drift current within a loop aperture (magnetic gap M) defined by the racetrack-shaped slit 35. Gas flowing through the electric gap (E) is ionized thereby creating plasma. The plasma expands and fills the space just above the anode 27 including an area proximate slit 35 defined between the inner 29a and outer 29b cathode portions. A magnetic field 33 is defined in the magnetic gap (M) between the inner and outer cathode 29 portions at slit 35. The magnetically confined electrons further enhance the plasma density while the resulting perpendicular electric field accelerates ions 34 from above the anode 27 through the magnetic gap (M) between the inner and outer cathode 29 portions toward the substrate to be coated, cleaned and/or milled.

In certain example embodiments of this invention, the electric gap (E) between the anode and cathode may be from 1.0 to 5.0 mm, more preferably from 1.5 to 3.0 mm. In certain example embodiments of this invention, the magnetic gap (M) between the inner 29a and outer 29b cathode 29 portions may be from 1.5 to 6.0 mm, more preferably from 2.0 to 4.0 mm. The magnetic gap (M) may be larger than the electric gap (E) in certain example embodiments. The source may be operated at a pressure less than atmospheric in certain instances, for example from 0.1 to 3.0× $10^{-3}$ Torr. Gas flow in the source may range from 20 to 140 sccm in certain example embodiments, while the anode voltage may be from 0.5 to 5 kV in certain example embodiments. Various feedstock gases such as argon, oxygen, acetylene ($C_2H_2$), and/or other types of hydrocarbon gases may be used in the source in certain example embodiments of this invention.

The ion beam source may be operated over a wide range of applied voltages to deliver ions with kinetic energies ranging from about 100 eV to several thousands of eV. The ion beam generated may be collimated, focused, or diffused in different embodiments of this invention. In certain embodiments of this invention, the ion beam source is used to etch and/or mill a substrate. In etching/milling embodiments, gas(es) such as Ar and/or $O_2$ may be used in the source, with resulting ions (e.g., Ar ions) being directed toward the substrate to be etched and/or milled. When it is desired to use the ion beam source to deposit a film such as diamond-like carbon (DLC) on a substrate (e.g., glass), at least a hydrocarbon gas(es) such as acetylene may be used in the source.

Coating 40 is provided on at least a portion of anode 27 and/or cathode 29 in certain embodiments of this invention. In certain example embodiments of this invention, electrode coating 40 may be of or include a material that has a sputtering yield less than that of an uncoated anode or cathode. In certain example embodiments, the sputtering yield of coating 40 is no more than about 50% than that of an uncoated anode or cathode, more preferably no more than about 20% than that of an uncoated anode or cathode, and most preferably no more than about 10% than that of an uncoated anode or cathode given normal operating conditions of the source. Thus, because coating 40 has a sputtering yield much less than that of an uncoated anode 27 and/or cathode 29, during operation of the ion beam source with coating 40 provided on 27 and/or 29, much less cathode and/or anode material is sputtered or otherwise undesirably directed toward the substrate. As a result, substrate and/or film contamination can be reduced and/or prevented due to the use of coating 40 on one or both of anode 27 and cathode 29.

In certain embodiments of this invention, the coating 40 has a melting point of at least about 2,000 degrees C., more preferably of at least about 2,500 degrees C., and most preferably of at least about 2,800 degrees C.

In the FIG. 1 embodiment, only the surface of anode 27 facing the electric gap (E) is coated with coating 40. However, in other example embodiments of this invention, the entire anode 27 may be coated with coating 40, or alternatively only a portion of the surface of the anode facing the gap E may be coated with coating 40. Three of the four anode 27 surfaces may be coated in other embodiments. In a similar manner, in the FIG. 1 embodiment of this invention the only part of the cathode 29 that is coated with coating 40 is the major surface facing the substrate to be coated and the surface defining the magnetic gap M (or slit 35). However, in other example embodiments of this invention, the entire cathode 29 may be coated with coating 29. In other alternative embodiments, only the surfaces of cathode 29 adjacent gaps E and/or M need be coated with coating 40. In any event, in certain preferred embodiments of the invention, coating 40 is provided on anode 27 and/or cathode 29 surfaces adjacent to electric gap (E) and/or magnetic gap (M), since this is where the anode and/or cathode tend to erode the quickest if the coating 40 is not present. As a result, the gap(s) M and/or E vary less over time, and/or the source may be operated for longer periods of time without re-building and/or cleaning.

Coating 40 is conductive in certain example embodiments of this invention, so as to enable the electric field to be properly formed in the electric gap (E) between the anode 27 and cathode 29 thus allowing good operation of the ion beam source. In certain embodiments of this invention, coating 40 is a good refractory so as to be resistant to oxidation which may tend to occur on a uncoated electrode during cleaning with oxygen gas or the like.

Coating 40 may be of any suitable material satisfying one or more of the aforesaid characteristics. In certain example embodiments of this invention, coating 40 may be of or include a metal boride (MeB$_x$), such as titanium diboride (TiB$_2$) or zirconium diboride (ZrB$_2$). In addition to Ti and Zr, the metal (Me) may be Ta or Fe in certain alternative embodiments (e.g., coating of or including TaB or Fe$_2$B), and x is generally from 1 to 4. Thus, "boride" means a boride of any valence including for example, monoboride, diboride, triboride and tetraboride compounds. In other embodiments of this invention, coating 40 may be of or include a nitride such as titanium nitride or the like, and/or a carbide such as boron carbide. The coating 40 may be crystalline and/or amorphous in different embodiments of this invention. These example materials are conductive, refractory, substantially chemically inert, and have sputtering yield(s) much less than conventional uncoated steel anodes/cathodes. These materials may or may not be doped with other element(s) in different embodiments of this invention. When such materials are used in coating 40, the coating may be formed on the cathode 29 and/or anode 27 by way of sputtering, CVD, or in any other suitable manner (e.g., in the case of a titanium boride coating 40, the coating may be formed on the anode and/or cathode by sputtering a titanium boride (e.g., TiB$_2$) cathode target while negatively biasing the anode/cathode to be coated). These suitable example materials for coating 40 are provided for purposes of example only, and are not intended to be limiting as other coating materials may also be used.

Coating 3 has a sheet resistance (if using a reference thickness of 250 angstroms measurable if deposited on a reference glass sheet, for example and without limitation) R$_s$ of less than 50 ohms/square, more preferably less than 20 ohms/square, and most preferably less than 15 ohms/square in certain example embodiments of this invention. Coating 3 may in certain example embodiments also have a bulk resistivity of no greater than about 20×10$^{-5}$ ohms-cm, more preferably no greater than about 10×10$^{-5}$ ohms-cm, and most preferably no greater than about 2.5×10$^{-5}$ ohms-cm.

In certain example embodiments of this invention, the coating 40 is of a material different than the material being ion beam deposited onto the substrate and/or the gas being used for etching/milling, and/or the coating 40 is formed on the anode and/or cathode before operation of the source. In other words, the ion source is manufactured so as to have an anode 27 and/or cathode 29 that is at least partially coated with coating 40.

In certain example embodiments of this invention, coating 40 may be at least about 1 μm thick, more preferably at least about 5 μm thick. In certain embodiments, the coating 40 may have a thickness of from about 1 to 30 μm thick, more preferably from about 5 to 20 μm thick, and most preferably from about 10–15 μm thick. These thicknesses are provided for purposes of example. The coating 40 may be of a substantially uniform thickness in all areas where the coating is provided in certain example embodiments of this invention; while in other embodiments the coating 40 may be deposited thicker in areas adjacent gap(s) E and/or M than in areas not adjacent the same. In certain example embodiments of this invention, coating 40 may have a hardness of from about 10 to 80 GPa, more preferably from about 20 to 70 GPa.

FIG. 1 illustrates coating 40 being deposited directly on the anode and cathode. However, the instant invention is not so limited. For example, in alternative embodiments of this invention, other layer(s) may be provided between the coating 40 and the anode 27 and/or cathode 29. In still other embodiments, other layer(s) may be provided on the anode 27 and/or cathode 29 over coating 40.

Figure 3:
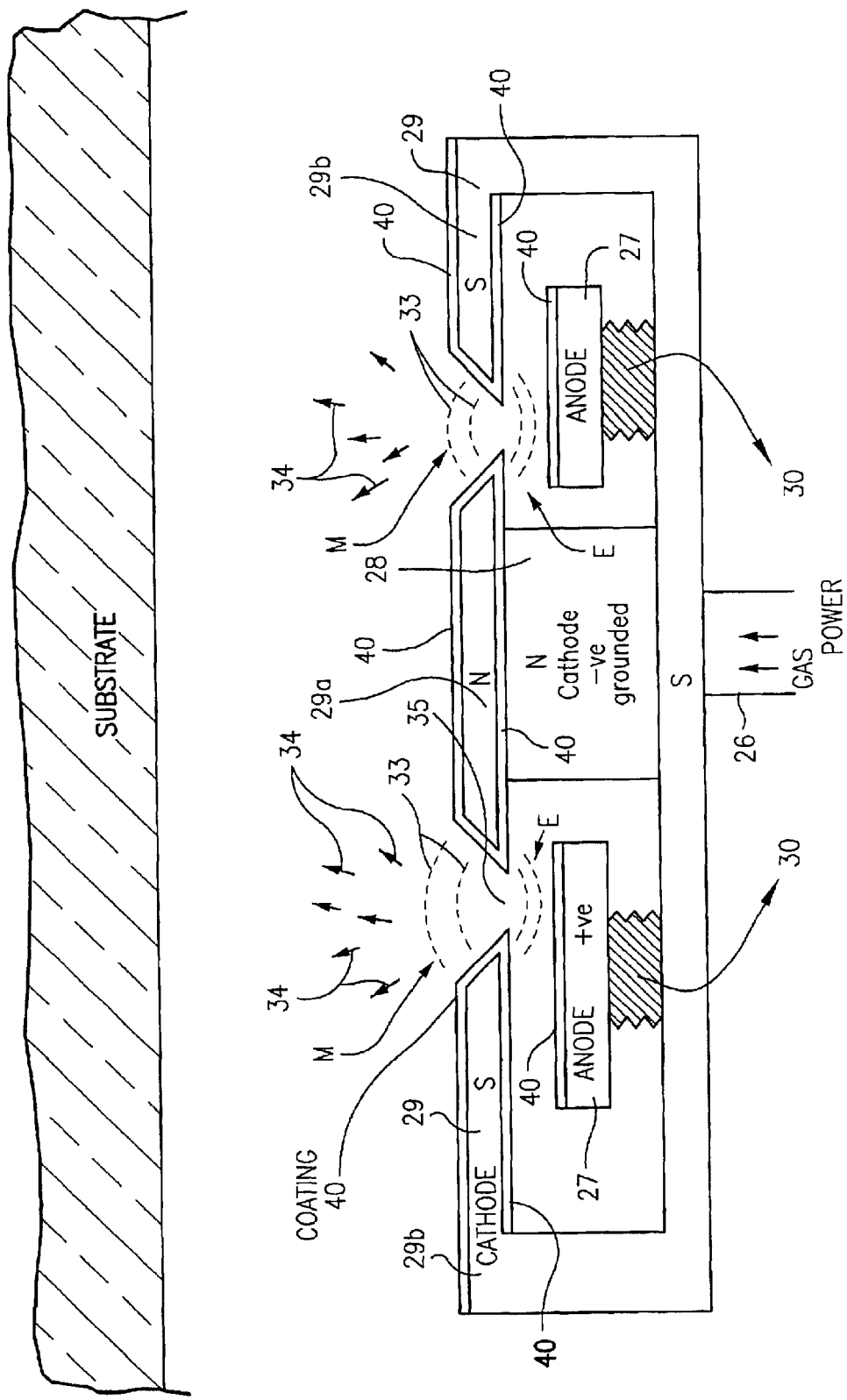
FIG. 3 is a partial cross sectional view of a cold cathode closed drift type ion beam source according to another example embodiment of this invention.

FIG. 3 illustrates another embodiment of this invention where coating 40 is also provided on an interior surface of the cathode 20 across the electric gap from the anode.

The ion beam source(s) of FIGS. 1–3 may be used in any suitable manner. For purposes of example and without limitation, the source may be used to ion beam mill a glass substrate during the making of a vehicle or architectural window product. Alternatively, the ion beam source may be used to deposit a thin film on a glass substrate during the making of a window product. Alternatively, the ion beam source may be used to etch or mill a semiconductor substrate during the manufacture of a semiconductor device, and/or to deposit a thin film thereon. Moreover, the ion beam source may be used to deposit any of the layer(s) as discussed in any of U.S. Pat. Nos. 6,395,333, 6,335,086, 6,338,901, or 6,261,693 (all incorporated herein by reference), or may be used to ion beam mill a substrate as discussed in U.S. Pat. No. 6,368,664 (incorporated herein by reference), and/or may be used to make any of the products discussed in any of the aforesaid patents.

While the invention has been described in connection with what is presently considered to be the most practical and preferred embodiment, it is to be understood that the invention is not to be limited to the disclosed embodiments, but on the contrary, is intended to cover various modifications and equivalent arrangements included within the spirit and scope of the appended claims.

What is claimed is:

1. An ion source comprising:

an anode and a cathode, with an electric gap defined between the anode and the cathode; and wherein each of the anode and cathode is at least partially coated with a conductive coating comprising a metal boride.

2. The ion source of claim 1, wherein the metal boride is MeB$_x$, where Me is one of Ti, Zr, Ta and Fe.

3. The ion source of claim 2, wherein x in MeB$_x$ is from about 1 to 4.

4. The ion source of claim 1, wherein the metal boride comprises one of TiB$_2$ and ZrB$_2$.

5. The ion source of claim 1, wherein the metal boride comprises titanium boride.

6. The ion source of claim 1, wherein the coating is from about 5 to 20 μm thick.

7. The ion source of claim 1, wherein the cathode is coated with the coating at least in an area adjacent the electric gap.

8. The ion source of claim 1, wherein a sputtering yield of the coating is no more than about 20% of that of an uncoated anode or cathode, given a reference gas of acetylene ($C_2H_2$) being fed through the ion source.

9. The ion source of claim 1, wherein the ion source is a cold-cathode closed-drift type ion beam source.

10. The ion source of claim 1, wherein the coating has a bulk resistivity of no greater than about $20 \times 10^{-5}$ ohms-cm.

11. The ion source of claim 1, wherein another layer is provided between the coating and the anode and/or cathode on which the coating is provided.

12. An ion source comprising:

a conductive anode and a conductive cathode, with a gap defined between the anode and the cathode; and wherein the ion source is manufactured so that each of the anode and cathode is at least partially coated with a coating comprising a metal boride.

13. The ion source of claim 12, wherein the metal boride is $MeB_x$, where Me is one of Ti, Zr, Ta and Fe.

14. The ion source of claim 12, wherein the metal boride comprises one of $TiB_2$ and $ZrB_2$.

15. The ion source of claim 12, wherein the coating has a bulk resistivity of no greater than about $20 \times 10^{-5}$ ohms-cm.

16. An ion source comprising:

a conductive anode and a conductive cathode, with an electric gap defined between the anode and the cathode; and wherein the ion source is manufactured so that at least one of the anode and cathode is at least partially coated with a conductive coating having a sputtering yield of no more than about 20% of the sputtering yield of an uncoated anode or cathode, the conductive coating having such a sputtering yield of no more than about 20% of that of an uncoated anode or cathode given a reference gas of acetylene ($C_2H_2$) being fed through the ion source.

17. The ion source of claim 16, wherein the conductive coating has a sputtering yield of no more than about 10% of the sputtering yield of an uncoated anode or cathode given a reference gas of acetylene ($C_2H_2$) being fed through the ion source.

18. The ion source of claim 16, wherein the coating comprises at least one of a metal boride, a boron carbide, and a metal nitride.

19. The ion source of claim 16, wherein the coating has a bulk resistivity of no greater than about $20 \times 10^{-5}$ ohms-cm.

20. The ion source of claim 16, wherein each of the anode and cathode is at least partially coated with a conductive coating, and wherein the conductive coating comprises a boride of at least one metal.

21. An ion source comprising:

a conductive anode and a conductive cathode, with a gap defined between the anode and the cathode; and wherein the ion source is manufactured so that each of the anode and cathode is at least partially coated with a coating comprising each of: a boride, a nitride, and a carbide.

22. The ion source of claim 21, wherein a sputtering yield of the coating is no more than about 20% of that of an uncoated anode or cathode, given a reference gas of acetylene ($C_2H_2$) being fed through the ion source.

* * * * *